United States Patent
Roberts et al.

(10) Patent No.: US 12,526,967 B2
(45) Date of Patent: Jan. 13, 2026

(54) VEHICLE POWER ELECTRONICS COOLER WITH INTEGRATED HEATING ELEMENT

(71) Applicant: Atieva, Inc., Newark, CA (US)

(72) Inventors: Blake Roberts, Fremont, CA (US); Samaneh Sadri, Redwood City, CA (US); Jeremy Swiger, Mountain View, CA (US); Bai Shao, Fremont, CA (US)

(73) Assignee: Atieva, Inc., Newark, CA (US)

( * ) Notice: Subject to any disclaimer, the term of this patent is extended or adjusted under 35 U.S.C. 154(b) by 287 days.

(21) Appl. No.: 18/338,865

(22) Filed: Jun. 21, 2023

(65) Prior Publication Data

US 2024/0431078 A1     Dec. 26, 2024

(51) Int. Cl.
*H05K 7/20*     (2006.01)

(52) U.S. Cl.
CPC ..... *H05K 7/20927* (2013.01); *H05K 7/20254* (2013.01); *H05K 7/20327* (2013.01); *H05K 7/20436* (2013.01); *H05K 7/20854* (2013.01); *H05K 7/20872* (2013.01); *H05K 7/209* (2013.01)

(58) Field of Classification Search
CPC .......... H01M 10/625; H05K 7/20254; H05K 7/20263; H05K 7/20272; H05K 7/20436; H05K 7/20854; H05K 7/20872; H05K 7/209; H05K 7/20927
See application file for complete search history.

(56) References Cited

U.S. PATENT DOCUMENTS

| | | | |
|---|---|---|---|
| 6,234,239 B1 | 5/2001 | Azar | |
| 6,959,492 B1 | 11/2005 | Matsumoto et al. | |
| 11,835,303 B2 * | 12/2023 | Girmscheid | H01M 10/6554 |
| 2012/0003516 A1 * | 1/2012 | Eisenhour | H01M 10/625 |
| | | | 429/62 |
| 2012/0292298 A1 * | 11/2012 | Fleury | H01M 10/625 |
| | | | 219/202 |
| 2014/0262177 A1 | 9/2014 | Tang et al. | |
| 2018/0259273 A1 | 9/2018 | Wang | |
| 2020/0295626 A1 | 9/2020 | Yuan et al. | |
| 2021/0180880 A1 | 6/2021 | Zhou et al. | |

(Continued)

FOREIGN PATENT DOCUMENTS

| | | |
|---|---|---|
| JP | 2019168190 A | 10/2019 |
| WO | 2015179306 A1 | 11/2015 |

(Continued)

OTHER PUBLICATIONS

Machine translation completed May 29, 2025, for WO 2020/212921 by Lasagni et al. (Year: 2025).*

(Continued)

*Primary Examiner* — Jayprakash N Gandhi
*Assistant Examiner* — Steven Ngo
(74) *Attorney, Agent, or Firm* — Brake Hughes Bellermann LLP

(57) ABSTRACT

A cooler for power electronics comprises: a housing having a cooling surface configured for contacting the power electronics; an inlet and an outlet coupled to the housing; a manifold inside the housing providing a flow of coolant in the cooler, the manifold coupled to the inlet and the outlet; and a heating element mounted to the housing and configured to heat the coolant, the heating element controlled independently of the power electronics.

18 Claims, 15 Drawing Sheets

(56) References Cited

U.S. PATENT DOCUMENTS

| | | | |
|---|---|---|---|
| 2022/0015271 A1 | 1/2022 | De Sousa et al. | |
| 2022/0030747 A1* | 1/2022 | Okuno | F25D 17/02 |
| 2022/0248560 A1* | 8/2022 | Zhou | H05K 7/2039 |
| 2024/0215211 A1* | 6/2024 | Matsuoka | H02M 7/5387 |
| 2025/0158150 A1* | 5/2025 | Xu | B60H 1/00278 |

FOREIGN PATENT DOCUMENTS

| | | | | |
|---|---|---|---|---|
| WO | WO-2020212921 A1 * | 10/2020 | | H05K 7/20927 |
| WO | 2021094337 A1 | 5/2021 | | |

OTHER PUBLICATIONS

International Search Report and Written Opinion for PCT Application No. PCT/US2024/034744, mailed on Oct. 2, 2024, 11 pages.
International Search Report and Written Opinion for PCT Application No. PCT/US2022/078588, mailed on Jan. 31, 2023, 8 pages.

* cited by examiner

VEHICLE POWER ELECTRONICS COOLER WITH INTEGRATED HEATING ELEMENT

TECHNICAL FIELD

This document relates to a vehicle power electronics cooler with an integrated heating element.

BACKGROUND

Power electronics are used in a variety of situations. In an electric vehicle (EV), power electronics can be used in an on-board charger for the vehicle, a current converter, a junction box, and/or heater control components. The power electronics generate heat that may need to be managed. Present power electronics coolers may not be sufficiently flexible for the needs of today's EVs.

SUMMARY

In an aspect, a cooler for power electronics comprises: a housing having a cooling surface configured for contacting the power electronics; an inlet and an outlet coupled to the housing; a manifold inside the housing providing a flow of coolant in the cooler, the manifold coupled to the inlet and the outlet; and a heating element mounted to the housing and configured to heat the coolant, the heating element controlled independently of the power electronics.

Implementations can include any or all of the following features. The heating element is positioned downstream in the flow of the coolant from an inside of the cooling surface. The heating element is positioned inside the manifold. The heating element is U-shaped with two arms parallel to each other. The heating element is positioned at an outside surface of the housing. The manifold includes (i) an inlet manifold coupled to the inlet, (ii) an outlet manifold coupled to the outlet, and (iii) a coolant passage coupled to the inlet manifold and to the outlet manifold, the coolant passage partially formed by an inside of the cooling surface. The cooler further comprises structure inside the coolant passage to affect the flow. The manifold is configured so that a first flow direction of the flow inside the coolant passage is substantially perpendicular to a second flow direction of the flow in the inlet manifold and to a third flow direction of the flow in the outlet manifold. The second and third flow directions are opposite to each other. The second and third flow directions are a common flow direction. The manifold further comprises a channel structure that houses the heating element, and wherein a fourth flow direction of the flow in the channel structure is opposite to the second and third flow directions. The heating element comprises multiple arms parallel to each other, and wherein the channel structure comprises respective channels for the multiple arms. The channel structure consists of a first channel and a second channel, wherein the first and second channels are formed on opposite sides of a raised portion inside the manifold, the housing further comprising a member covering the channel structure to form the first and second channels. The coolant passage is positioned between the heating element and an inside of the cooling surface. After passing through the outlet manifold in the third flow direction, the coolant makes substantially a 180-degree turn and flows along the heating element in a fourth flow direction. The housing has a substantially rectangular shape with first and second longer sides parallel to each other, and first and second shorter sides parallel to each other. The inlet is positioned at the first shorter side, and wherein the outlet is positioned at the second shorter side. The heating element is positioned at the second shorter side. The heating element comprises a coil with multiple turns. The inlet is positioned at the first shorter side, and wherein the outlet is positioned at the first shorter side. The housing further comprises multiple openings in the coolant passage, the openings leading to a channel that houses the heating element. The cooler further comprises mounts at the cooling surface, the mounts configured for mounting the power electronics and the cooler to each other.

BRIEF DESCRIPTION OF DRAWINGS

Like reference symbols in the various drawings indicate like elements.

DETAILED DESCRIPTION

Figure 1:
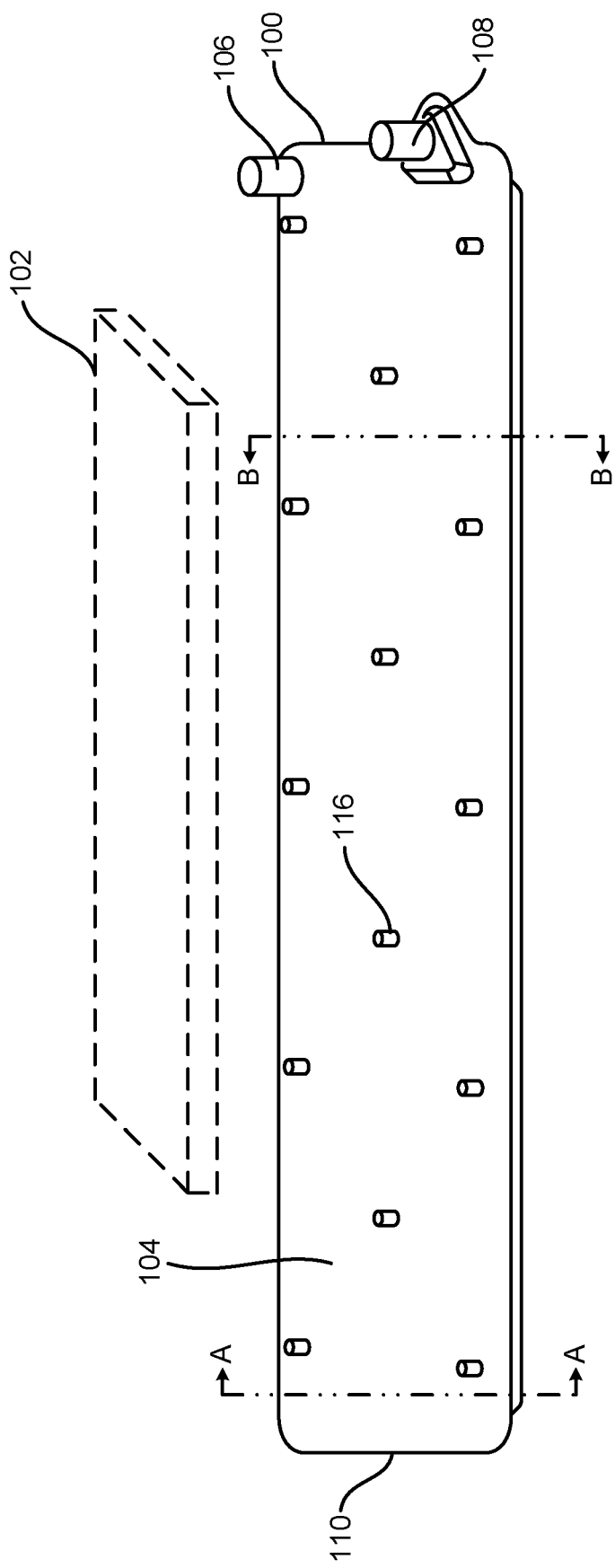
FIG. 1 shows an example of a cooler for power electronics.

This document describes examples of systems and techniques that provide a power electronics cooler with an integrated heating element. In some implementations, a cooler can provide a structural chassis (cooler plate) on which to mount power electronics. The cooler plate can allow a flow of coolant to maintain the temperature of critical power electronics components of a system such as an EV, while the integrated heating element can heat the outflowing coolant to provide supplementary heat to other systems of the vehicle when necessary. The heating element can be implemented in a way that maximizes heating/cooling efficiency based on packaging requirements. In some implementations, the heating element is positioned fully downstream of the cooling plate. In some implementations, the coolant can pass the heating element along a longitudinal extent thereof. For example, this can maximize coolant velocity throughout the entire length. The heating element can be positioned within the cooler based on the dimensions of a cooling surface for the power electronics, and/or based on the positions of the inlet(s) or outlet(s) of the cooler. The heating element can have any of various shapes, including but not limited to the examples shown herein. The heating element can be positioned alongside the cooling surface to maintain a planar shape of the cooler. Examples herein are illustrated by multiple drawings. Some of the views of the present drawings are shown partially transparent for clarity.

In some implementations, a heater can be integrated into a cold plate used for cooling a power electronics unit. Cooling of components can occur via heat transfer through the interface surface of the cooler plate into the coolant flowing through internal passages on the opposite side of the cooler plate from where the components are placed. A heating element that is incorporated into the cooler plate, directly in the coolant, and/or on an exterior surface of the cooler plate, can be activated (e.g., via an integrated heater control) to warm the coolant flowing in the cooler plate to provide heat to other vehicle systems. Such other vehicle systems can include, but are not limited to, the occupant cabin heater core or the high voltage battery. The present subject matter can provide a solution for integration of a coil heater into a cold plate that maximizes cooling/heating and minimizes packaging space.

Examples described herein refer to power electronics. As used herein, power electronics includes any circuitry that converts electric power using solid-state electronics (e.g., one or more semiconductor devices). In some implementations, the power electronics can include an on-board charger for the vehicle. Power electronics can relate to direct current (DC). For example, the power electronics can include a DC-to-DC converter (or DC-DC converter for short). Power electronics can relate to alternating current (AC). For example, the power electronics can include an AC junction box. Power electronics can include one or more circuit boards with components (e.g., serving as a controller).

Examples described herein refer to coolant. As used herein, coolant includes any fluid used to regulate temperature. The coolant can include water (optionally with one or more additives), to name just one example. Coolant that passes through a cooler as described herein can be circulated in a thermal system. For example, such a system can also include one or more features for releasing heat, such as by conduction, convection, and/or radiation.

Examples herein refer to a vehicle. A vehicle is a machine that transports passengers or cargo, or both. A vehicle can have one or more motors using at least one type of fuel or other energy source (e.g., electricity). Examples of vehicles include, but are not limited to, cars, trucks, and buses. The number of wheels can differ between types of vehicles, and one or more (e.g., all) of the wheels can be used for propulsion of the vehicle. The vehicle can include a passenger compartment accommodating one or more persons.

Examples described herein refer to a top, bottom, front, side, or rear. These and similar expressions identify things or aspects in a relative way based on an express or arbitrary notion of perspective. That is, these terms are illustrative only, used for purposes of explanation, and do not necessarily indicate the only possible position, direction, and so on.

Examples described herein use the term "couple" or a variation of it when describing that a first feature and a second feature are coupled to each other. As used herein, being coupled indicates that the features are in fluid communication with each other. In the above example, coolant can flow from the first feature to the second feature, and/or can flow from the second feature to the first feature.

Examples described herein mention that two or more features are contacting, or are in contact with, each other. As used herein, to contact indicates that the features are physically touching each other.

Figure 2:
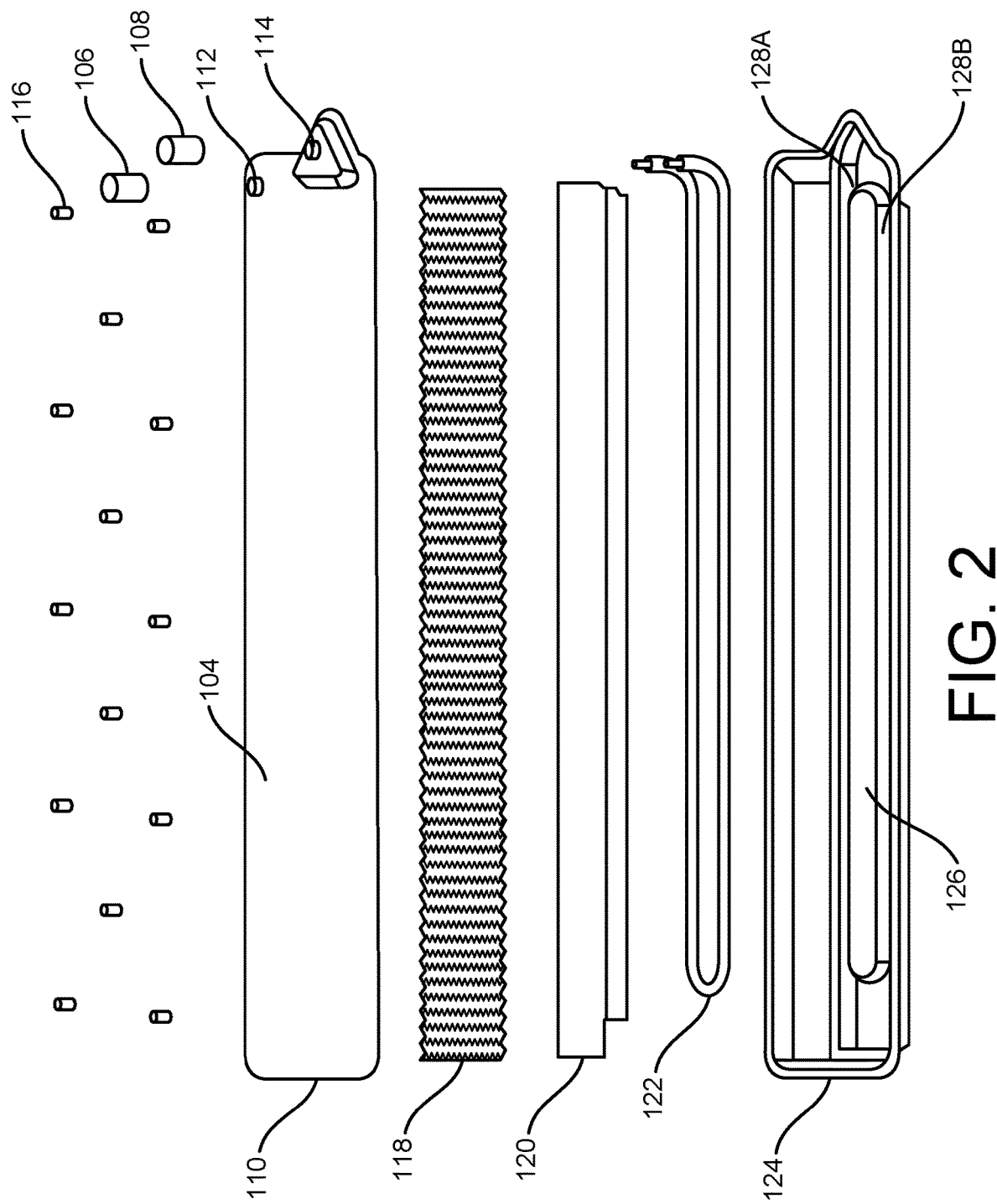
FIG. 2 shows a first example of an exploded view of the cooler of FIG. 1.

FIG. 1 shows an example of a cooler 100 for power electronics. FIG. 2 shows a first example of an exploded view of the cooler 100 of FIG. 1. A second example of an exploded view of the cooler 100 will be described later herein. The cooler 100 can be used with one or more other examples described elsewhere herein.

The cooler 100 is configured for use in cooling at least one power electronics unit 102. The power electronics unit 102 is here schematically shown and can include, but is not limited to, an on-board charger for an electric vehicle, a DC-to-DC converter, an AC junction box, a heater control, or an inverter. For example, the power electronics unit 102 can include one or more circuit boards, including, but not limited to, a printed circuit board. The cooler 100 has a surface 104 that is configured for coupling to the power electronics unit 102 for cooling. The power electronics unit 102 contacts the surface 104. In some implementations, the surface 104 includes mounts 116 extending substantially perpendicular to the surface 104. The power electronics unit 102 can be configured for contacting the surface 104. For example, the power electronics unit 102 contacts the surface 104 by being mounted to some or all of the mounts 116.

The cooler 100 can include at least one inlet tube 106 and at least one outlet tube 108, both coupled to a housing of the cooler 100. The inlet tube 106 and outlet tube 108 are configured to facilitate a flow of coolant through the cooler 100. While only a single inlet and a single outlet are shown here, more than one inlet and/or more than one outlet can be used in certain nonlimiting implementations described herein. The cooler 100 includes a cooling plate 110 that can provide the surface 104 so that the surface 104 faces the power electronics unit 102. For example, the inlet tube 106 can be coupled to an inlet 112 in the cooling plate 110. As another example, the outlet tube 108 can be coupled to an outlet 114 in the cooling plate 110. The terms inlet and outlet are here used as examples only, and in some implementations coolant can instead enter the cooler 100 through the outlet 114, and exit the cooler 100 through the inlet 112.

In some implementations, the cooler 100 can include at least one of the mounts 116 configured for mounting the power electronics unit 102 and the cooler 100 to each other. For example, the mount(s) 116 can include a member of metal or a synthetic material configured for attachment to the power electronics unit 102 and to the cooler 100 for positioning the power electronics unit 102 relative to the surface 104.

The cooler 100 includes a structure 118 configured to be positioned in a coolant passage of the cooler 100 to affect the flow of coolant through the cooler 100. The structure 118 can include holes or other structural features (e.g., spaced periodically or at irregular intervals) that are capable of affecting the flow of coolant. For example, the structure 118 can include a turbulator, pin fin arrangement, and/or a stamped plate (e.g., a dimple plate). That is, a cooler that uses structure in the cooling passage can use any of multiple approaches, including, but not limited to, stamped dimples and/or forged pin fins.

The cooler 100 includes a member 120 configured for covering one or more channels inside the housing of the cooler 100. For example, the member 120 can include a plate of a metal or synthetic material that has a planar or non-planar (e.g., by way of stamping) shape.

The cooler 100 includes a heating element 122 mounted to the housing and configured to heat the coolant. The heating element 122 can be controlled independently of the power electronics unit 102. That is, while control of the heating element 122 in its intended function may be linked to the operation of the power electronics unit 102, the power electronics unit 102 can be on while the heating element 122 is off, or vice versa, or both power electronics unit 102 and the heating element 122 can be on (or off) at the same time. For example, the heating element 122 can generate heat, and heat the coolant, whether or not the power electronics unit 102 is operating. Any kind of heating element can be used. In some implementations, the heating element 122 includes a resistive heater. For example, the heating element 122 is U-shaped with two arms parallel to each other. The heating element 122 is presented for illustrative purposes only. Any of a number of other shapes and/or heating technologies can be used, including, but not limited to, a planar heating element, a ceramic heating element, a coil heating element, an L-shaped heating element, or a tubular heating element.

The coolant flowing through the cooler 100 can be used to remove heat generated by the power electronics unit 102, whereby the temperature of the coolant increases. Moreover, the heating element 122 can be operated to further increase the temperature of the coolant. For example, this heating can be performed so that the coolant will provide heat to other vehicle systems after the coolant passes through the cooler 100.

The cooler 100 includes a base 124. In some implementations, at least the cooling plate 110 and the base 124 can form the housing of the cooler 100. The cooling plate 110 and the base 124 can be configured to form a manifold inside the cooler 100 coupled to the inlet 112 and the outlet 114. The manifold is a closed volume except for the openings at the inlet 112 and the outlet 114. In some implementations, the base 124 includes a raised portion 126. For example, the raised portion 126 can be formed in a stamping process. A channel 128A and a channel 128B can be formed on opposite sides of the raised portion 126. The channels 128A-128B can form a channel structure that houses the heating element 122. That is, when the heating element 122 includes multiple arms (e.g., as part of a U-shaped configuration), the channel structure can include (e.g., consist of) respective channels for the multiple arms. The member 120 can be configured for covering the channel structure (e.g., the channels 128A-128B). For example, this can ensure that each of the arms of the heating element 122 is contained in a respective channel, which provides higher flow velocity over the surface of the heating element 122, thus improving flow and/or heat transfer efficiency.

Figure 3:
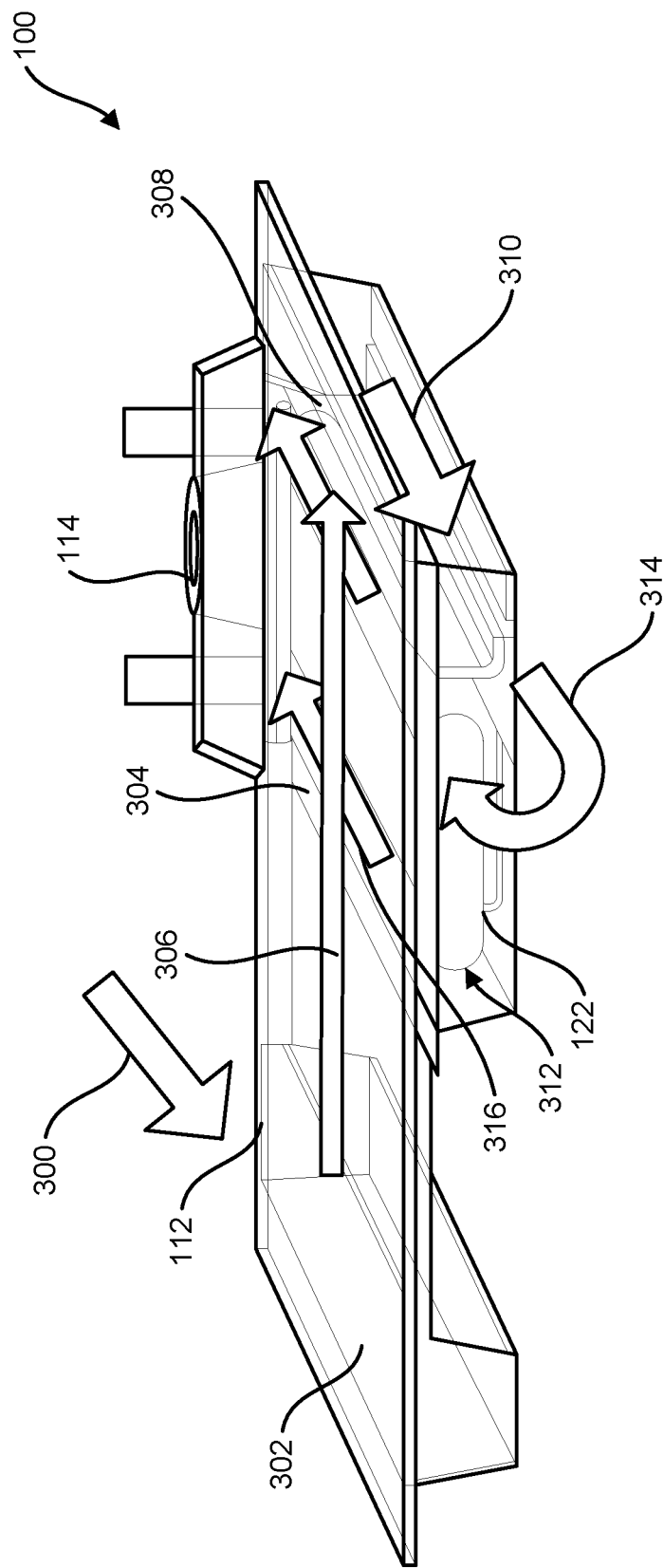
FIG. 3 shows an example cross section of the cooler of FIG. 2.

FIG. 3 shows an example cross section of the cooler 100 of FIG. 2. The cross section is taken along the line A-A in FIG. 1. The inlet 112 and the outlet 114 are indicated. An arrow 300 schematically illustrates that coolant enters the inlet 112 and flows in an inlet manifold 302 that is coupled to the inlet 112. The cooler 100 has a coolant passage 304 where coolant can flow from the inlet manifold 302, as schematically illustrated by an arrow 306. The coolant passage 304 can partially be formed by an inside of a cooling surface of the cooler 100 (e.g., the cooling surface can be the surface 104 of FIG. 1).

The cooler 100 has an outlet manifold 308 coupled to the outlet 114. The coolant passage 304 is coupled to the inlet manifold 302 and to the outlet manifold 308. The coolant passage 304, the inlet manifold 302, and the outlet manifold 308 can collectively form a manifold for the cooler 100, and the heating element 122 can be positioned inside the manifold. Coolant can flow in the outlet manifold 308 as schematically illustrated by an arrow 310. The cooler 100 includes a channel structure 312 that houses the heating element 122. The channel structure 312 can provide respective channels for multiple arms of the heating element 122.

After the coolant passes through the outlet manifold 308 as indicated by the arrow 310, the coolant makes substantially a 180-degree turn, as schematically illustrated by an arrow 314, and flows along the heating element 122 as schematically illustrated by an arrow 316. As such, the heating element 122 is positioned downstream in the flow of coolant from an inside of the cooling surface of the cooler 100. While a 180-degree turn is shown here, this implementation is presented for illustrative purposes only. Any of a number of other configurations can be used. In some implementations, a flow path inside a cooling plate can have another configuration, including, but not limited to, a U-shape, a snake shape, and/or a cross-flow configuration.

Figure 4:
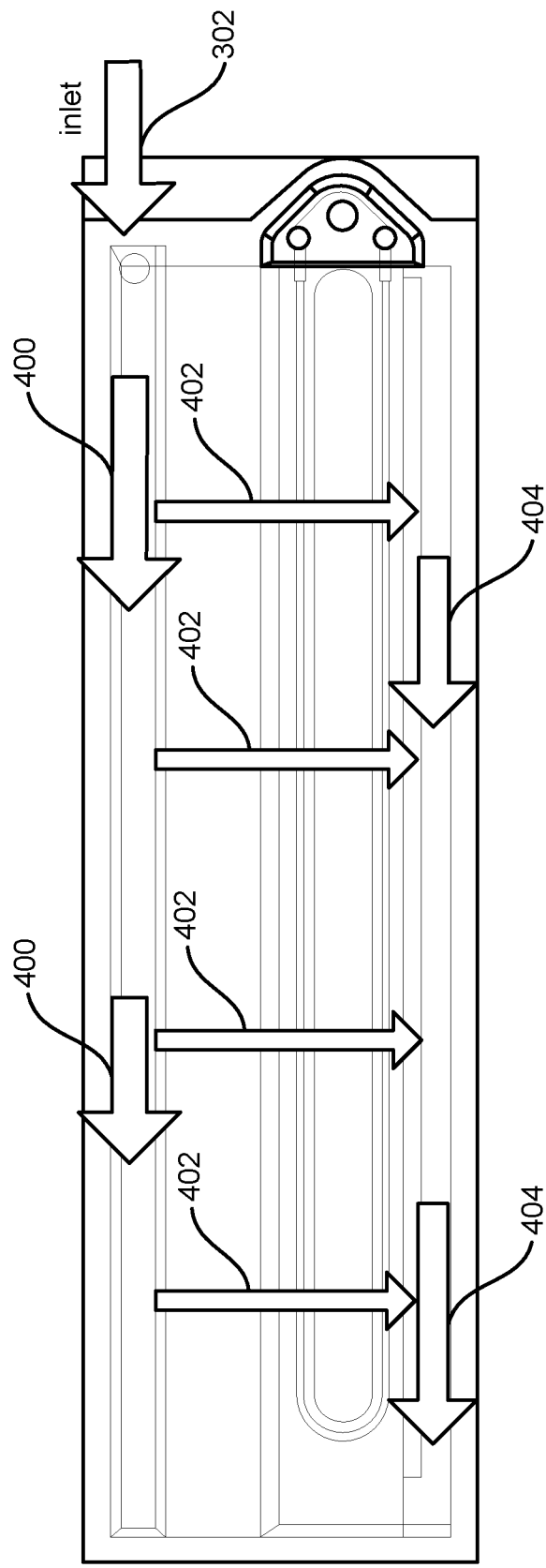
FIGS. 4-5 show examples of coolant flows of the cooler of FIG. 2.
Figure 5:
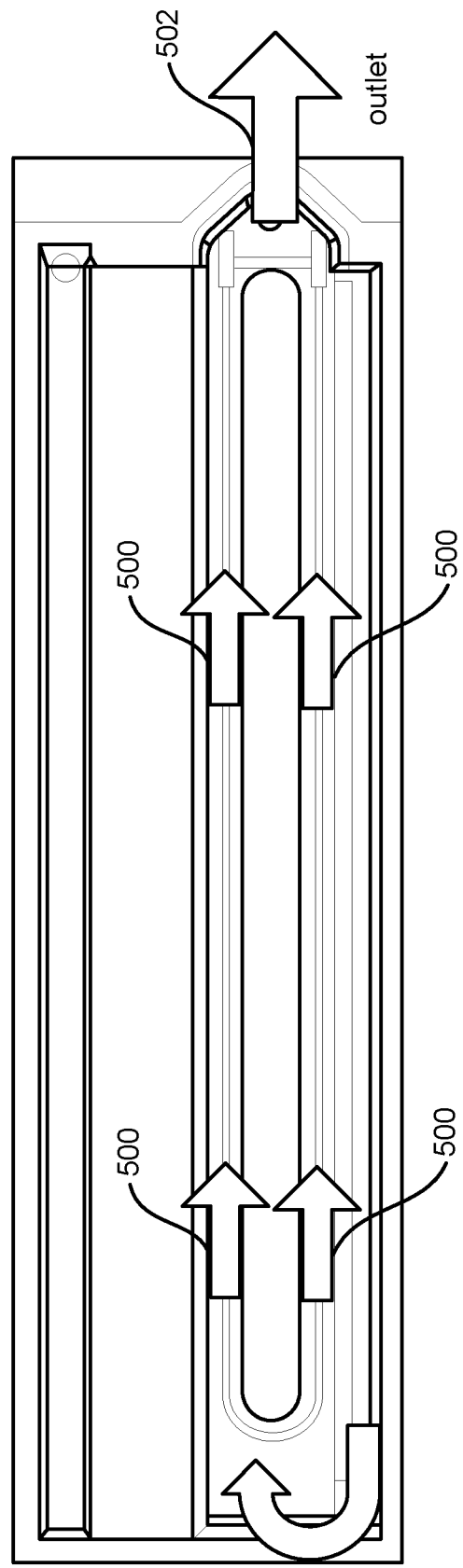

FIGS. 4-5 show examples of coolant flows of the cooler 100 of FIG. 2. Some elements from the description of FIG. 3 will be referenced for illustrative purposes. The arrow 300 and arrows 400 illustrate that the coolant flows through the inlet and through the inlet manifold 302. Arrows 402 illustrate that the coolant flows through the coolant passage 304. Arrows 404 illustrate that the coolant flows through the outlet manifold 308. Arrows 500 and 502 illustrate that the coolant flows through the channel structure 312 and exits through the outlet. Accordingly, a first flow direction (e.g., the arrows 402) of the flow inside the coolant passage in this example is substantially perpendicular to a second flow direction (e.g., the arrows 400) of the flow in the inlet manifold and to a third flow direction (e.g., the arrows 404) of the flow in the outlet manifold. The second and third flow directions (e.g., the arrows 400 and 404) can be a common (i.e., the same) flow direction. After passing through the outlet manifold in the third flow direction, the coolant can make substantially a 180-degree turn and flow along the heating element in a fourth flow direction (e.g., the arrows 500). The fourth flow direction of the coolant in the channel structure can be opposite to the second and third flow directions. The flow geometry represented by the arrows 400, 402, 404, 500, and 502 in this example can be characterized as a tri-port shape. A tri-port shape (e.g., as shown) can provide an advantageous balance between pressure drop and performance. In some implementations, more or fewer branches than shown here can be used.

The housing of the cooler 100 in this example has a substantially rectangular shape with first and second longer sides parallel to each other, and first and second shorter sides parallel to each other. The inlet 112 is positioned at the first shorter side (here at the right side in the illustration), and the outlet 114 is also positioned at the first shorter side. In other implementations, the housing of the cooler 100 can have a different shape.

Figure 6:
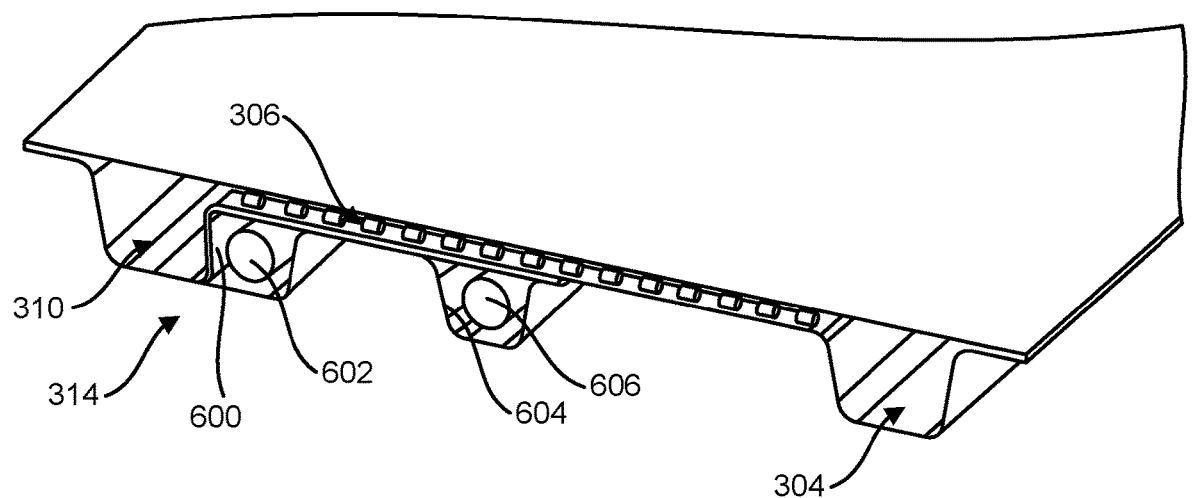
FIG. 6 shows an example cross section of the cooler of FIG. 2.

FIG. 6 shows an example cross section of the cooler 100 of FIG. 2. The cross section is taken along the line B-B in FIG. 1. The channel structure 312 here includes a channel 600 for an arm 602 of the heating element 122, and a channel 604 for an arm 606 of the heating element 122. Coolant can flow through the inlet manifold 302, through the coolant passage 304, through the outlet manifold 308, and finally through the channels 600-604.

Figure 7:
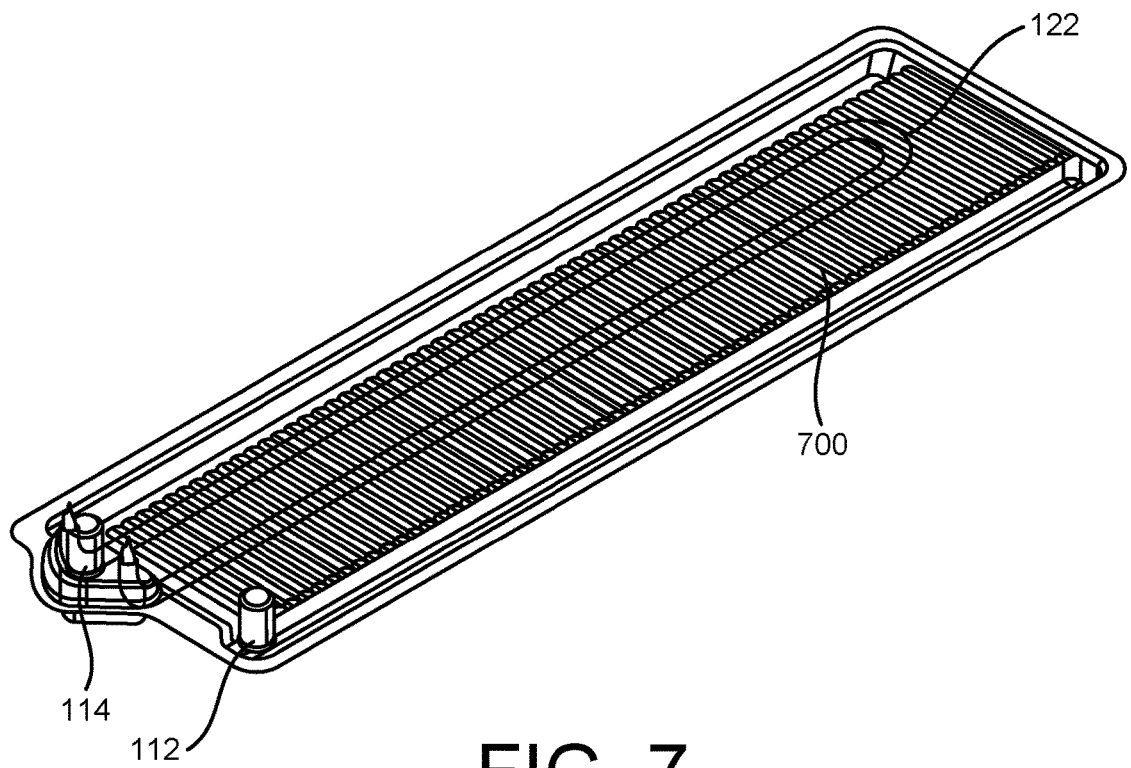
FIG. 7 shows an example of the base of the cooler of FIG. 2 with the inlet, outlet, heating element, and turbulator.

FIG. 7 shows an example of the base of the cooler 100 of FIG. 2 with the inlet 112, the outlet 114, the heating element 122, and a turbulator 700. The turbulator 700 is here schematically shown and is an example of structure that can be positioned inside a coolant passage to affect the flow and/or heat transfer.

Figure 8:
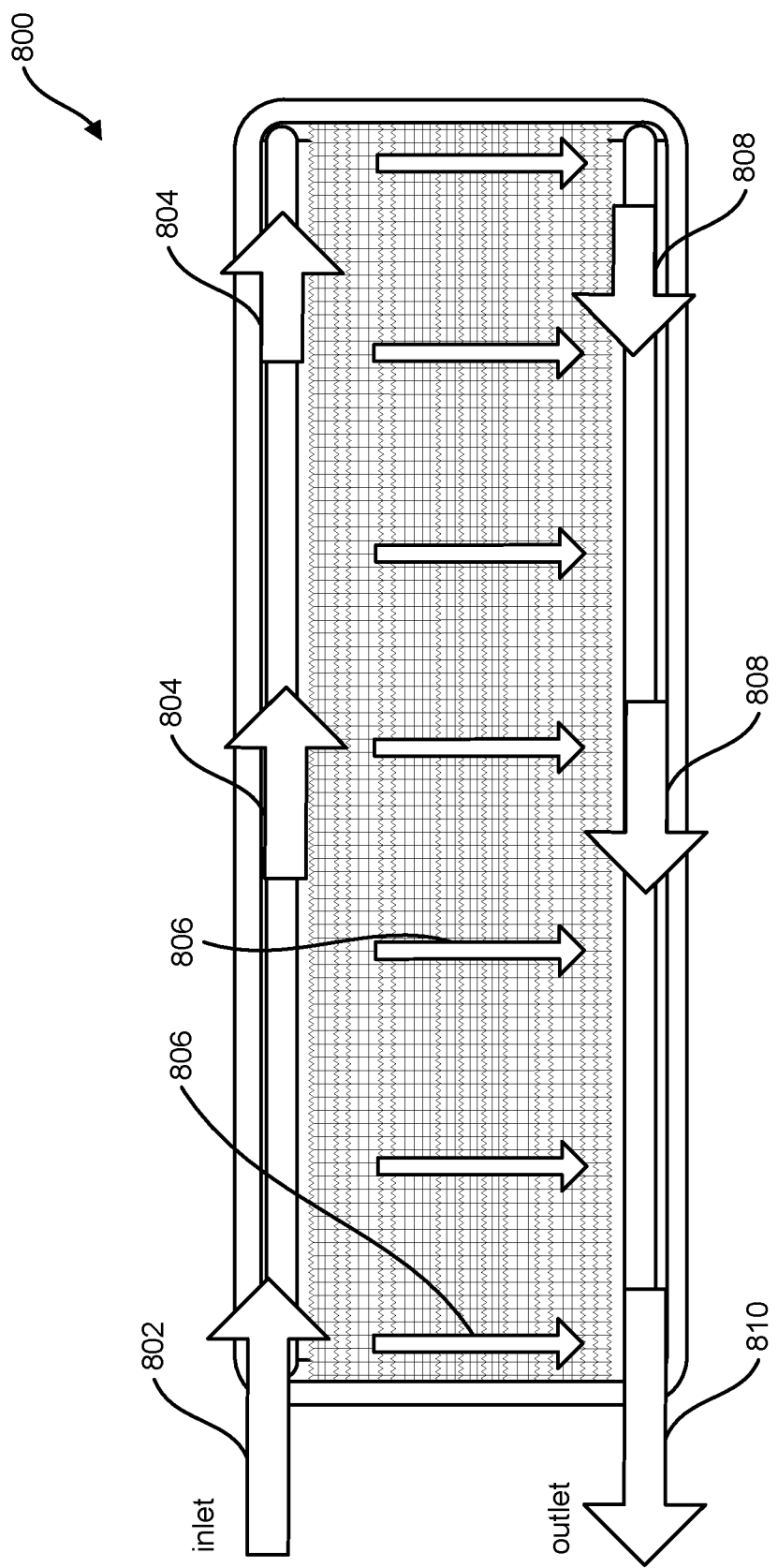
FIG. 8 shows a first example of flows in a cooler.

FIG. 8 shows a first example of flows in a cooler 800. The cooler 800 can be used with one or more other examples described elsewhere herein. An arrow 802 and arrows 804 illustrate that the coolant flows through an inlet of the cooler

800 and through an inlet manifold of the cooler 800. Arrows 806 illustrate that the coolant flows through a coolant passage. The coolant passage can partially be formed by an inside of a cooling surface of the cooler 800. Arrows 808 and 810 illustrate that the coolant flows through an outlet manifold of the cooler 800 and exits through an outlet of the cooler 800. The coolant contacts a heating element of the cooler 800 before exiting. For example, the heating element is in the outlet manifold. In this first example, a flow direction at the inlet (e.g., the arrows 802 and 804) is opposite to a flow direction at the outlet (e.g., the arrows 808 and 810). As such, the heating element is positioned downstream in the flow of coolant from an inside of the cooling surface of the cooler 800.

Figure 9:
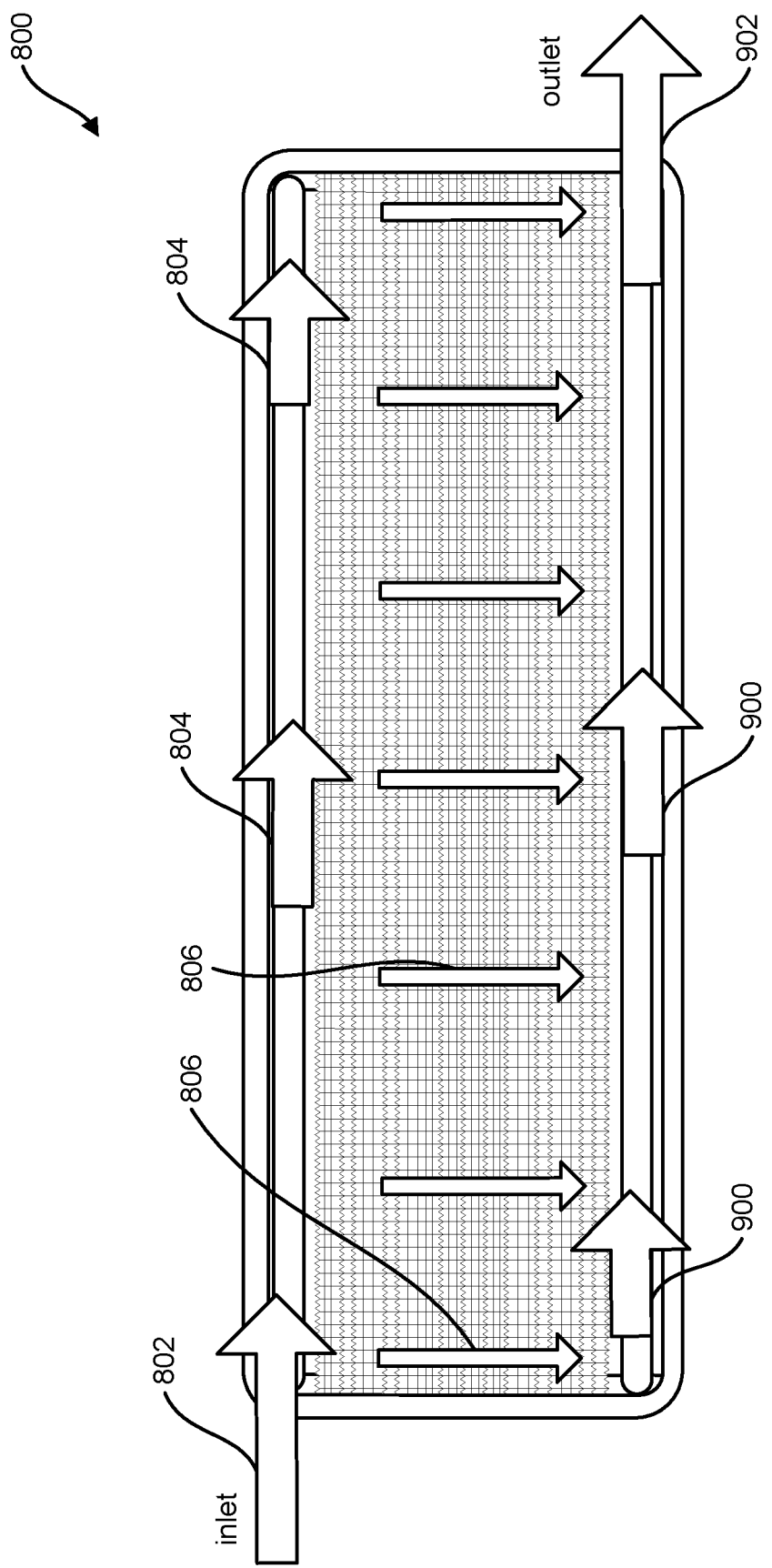
FIG. 9 shows a second example of flows in the cooler of FIG. 8.

FIG. 9 shows a second example of flows in the cooler 800 of FIG. 8. The arrow 802 and the arrows 804 illustrate that the coolant flows through the inlet of the cooler 800 and through the inlet manifold of the cooler 800. The arrows 806 illustrate that the coolant flows through the coolant passage. Arrows 900 and 902 illustrate that the coolant flows through an outlet manifold of the cooler 800 and exits through an outlet of the cooler 800. The coolant contacts a heating element of the cooler 800 before exiting. For example, the heating element is in the outlet manifold. In this second example, the flow direction at the inlet (e.g., the arrows 802 and 804) is common with a flow direction at the outlet (e.g., the arrows 900 and 902). The housing of the cooler 800 has a substantially rectangular shape with first and second longer sides parallel to each other, and first and second shorter sides parallel to each other. The inlet is positioned at the first shorter side (here at the left side in the illustration), and the outlet is positioned at the second shorter side (here at the right side in the illustration).

Figure 10:
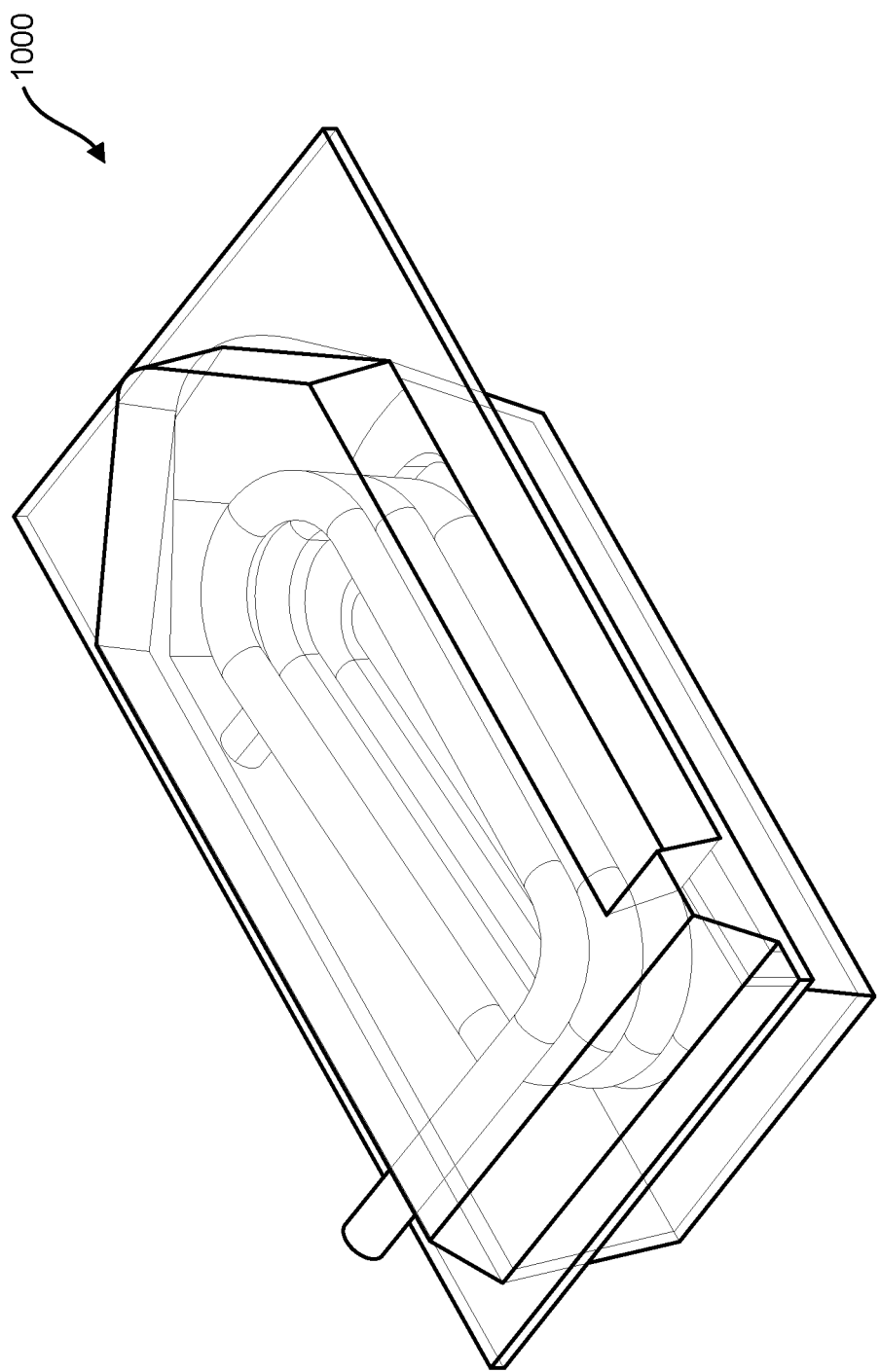
FIG. 10 shows an example of a heating element.
Figure 11:
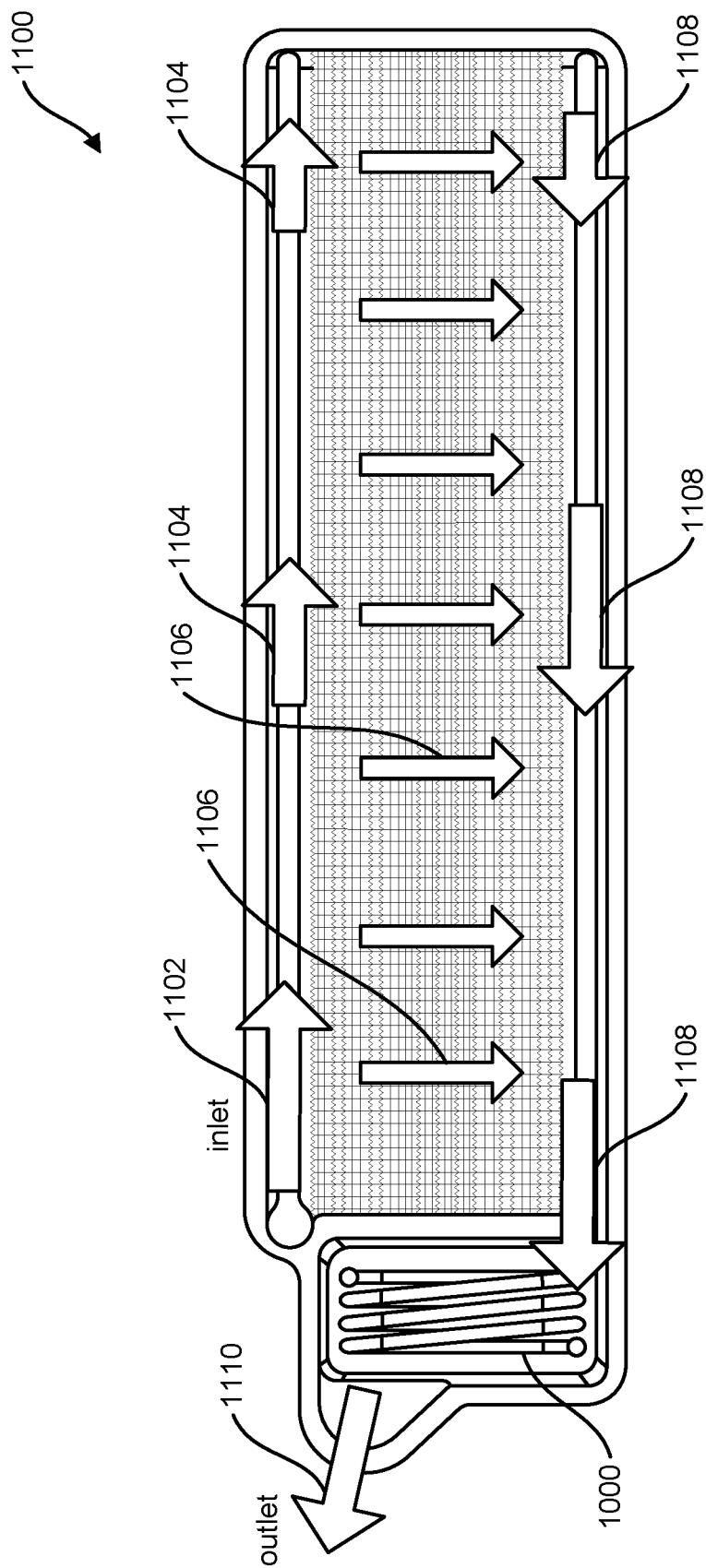
FIG. 11 shows an example of a cooler with the heating element of FIG. 10.

FIG. 10 shows an example of a heating element 1000. FIG. 11 shows an example of a cooler 1100 with the heating element 1000 of FIG. 10. The heating element 1000 and/or the cooler 1100 can be used with one or more other examples described elsewhere herein. The heating element 1000 comprises a coil with multiple turns and can be a resistive heating element. The heating element 1000 is positioned at an outside surface of the housing of the cooler 1100. Arrows 1102 and arrows 1104 illustrate that the coolant flows through an inlet of the cooler 1100 and through an inlet manifold of the cooler 1100. Arrows 1106 illustrate that the coolant flows through a coolant passage. Arrows 1108 illustrate that the coolant flows through an outlet manifold of the cooler 800 and into contact with the heating element 1000. An arrow 1110 illustrates that the coolant exits through an outlet of the cooler 1100. As such, the heating element 1000 is positioned downstream in the flow of coolant from an inside of the cooling surface of the cooler 1100. In this example, a flow direction at the inlet (e.g., the arrows 1102 and 1104) is opposite to a flow direction at the outlet (e.g., the arrows 1108). The housing of the cooler 1100 has a substantially rectangular shape with first and second longer sides parallel to each other, and first and second shorter sides parallel to each other. The inlet is positioned at the first shorter side (here at the left side in the illustration), and the heating element 1000 and the outlet are also positioned at the first shorter side.

Figure 12:
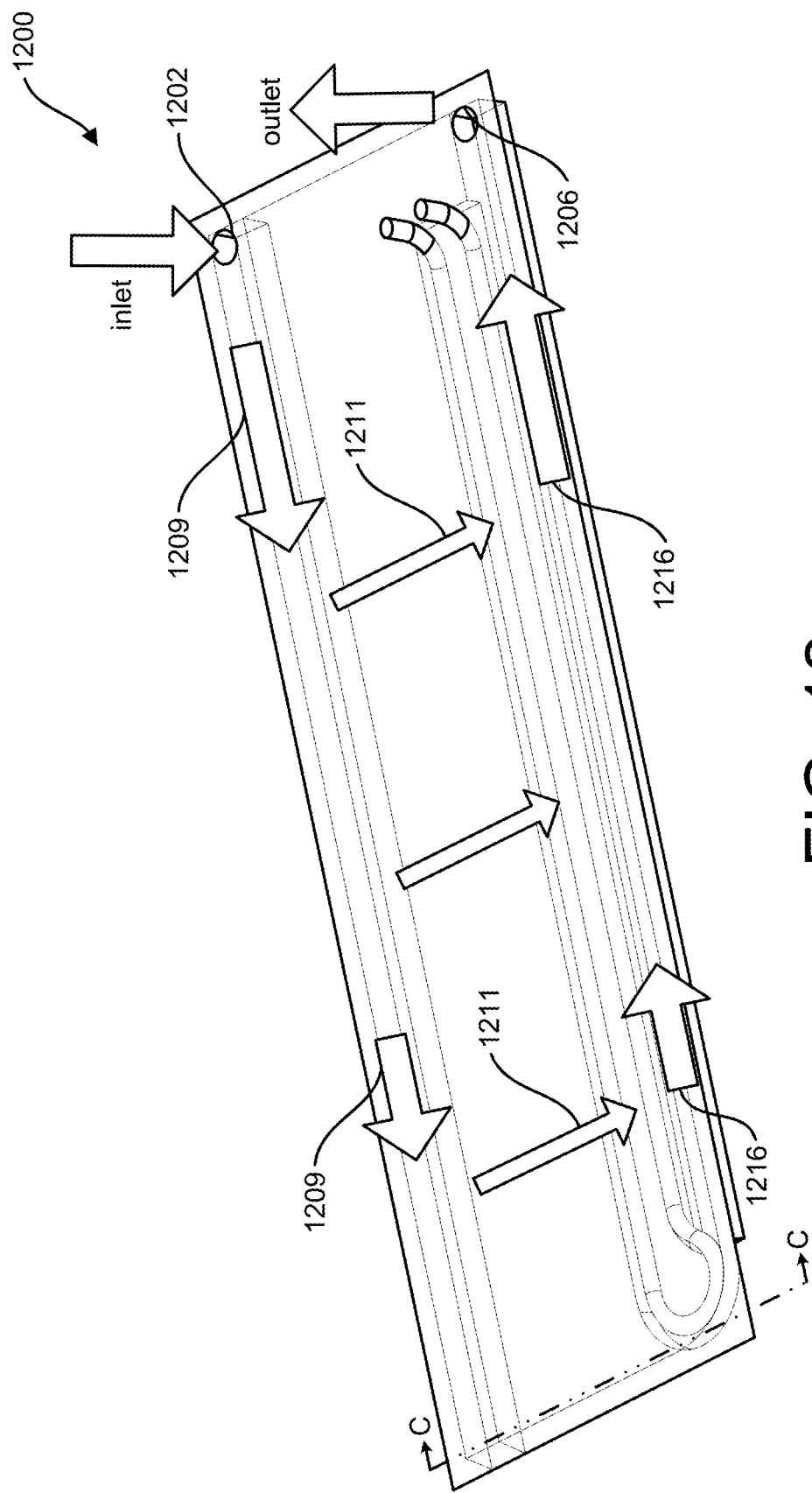
FIG. 12 shows an example of a cooler.
Figure 13:
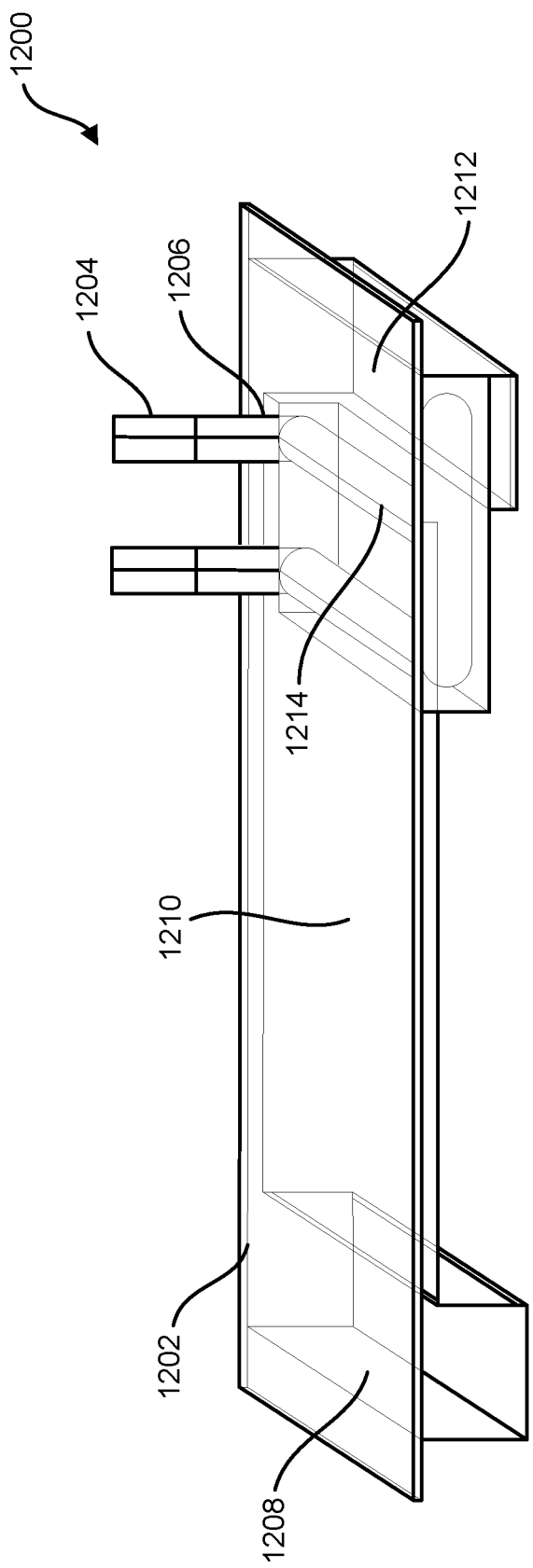
FIG. 13 shows an example cross section of the cooler in FIG. 12.

FIG. 12 shows an example of a cooler 1200. FIG. 13 shows an example cross section of the cooler 1200 in FIG. 12. The cross section of FIG. 13 is taken along the line C-C in FIG. 12. The cooler 1200 can be used with one or more other examples described elsewhere herein. An inlet 1202 is shown, and the cooler 1200 here has outlet tubes 1204 at an outlet 1206. Coolant enters the inlet 1202 and flows in an inlet manifold 1208 that is coupled to the inlet 1202, as indicated by arrows 1209. The cooler 1200 has a coolant passage 1210 where coolant can flow from the inlet manifold 1208, as indicated by arrows 1211. The coolant passage 1210 can partially be formed by an inside of a cooling surface of the cooler 1200 (e.g., the cooling surface can be the surface 104 of FIG. 1). In this example, a flow direction at the inlet (e.g., the arrows 1209) is opposite to a flow direction at the outlet (e.g., the arrows 1216).

The cooler 1200 has an outlet manifold 1212 coupled to the outlet 1206. The coolant passage 1210 is coupled to the inlet manifold 1208 and to the outlet manifold 1212. Coolant can flow through the coolant passage 1210, past a heating element 1214, and into the outlet manifold 1212. The coolant passage 1210, the inlet manifold 1208, and the outlet manifold 1212 can collectively form a manifold for the cooler 1200, and the heating element 1214 can be positioned inside the manifold. After the coolant passes through the outlet manifold 1212 as indicated by arrows 1216, the coolant can exit the cooler 1200 through the outlet 1206. In some implementations, the outlet 1206 is instead positioned at an opposite end of the cooler 1200 from the inlet 1202. As such, the heating element 1214 is positioned downstream in the flow of coolant from an inside of the cooling surface of the cooler 1200. The housing of the cooler 1200 has a substantially rectangular shape with first and second longer sides parallel to each other, and first and second shorter sides parallel to each other. The inlet 1202 is positioned at the first shorter side (here at the right side in the illustration), and the outlet 1206 is also positioned at the first shorter side.

Figure 14:
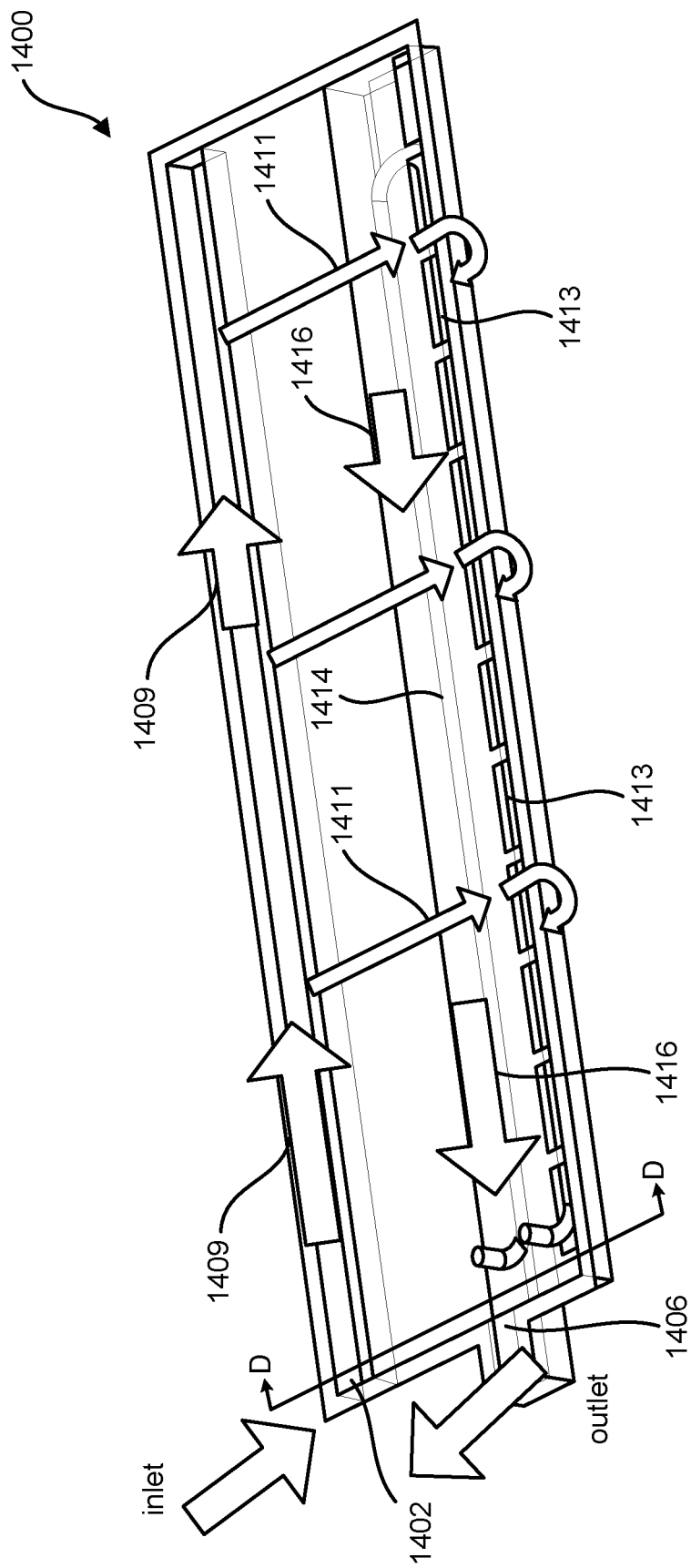
FIG. 14 shows an example of a cooler.
Figure 15:
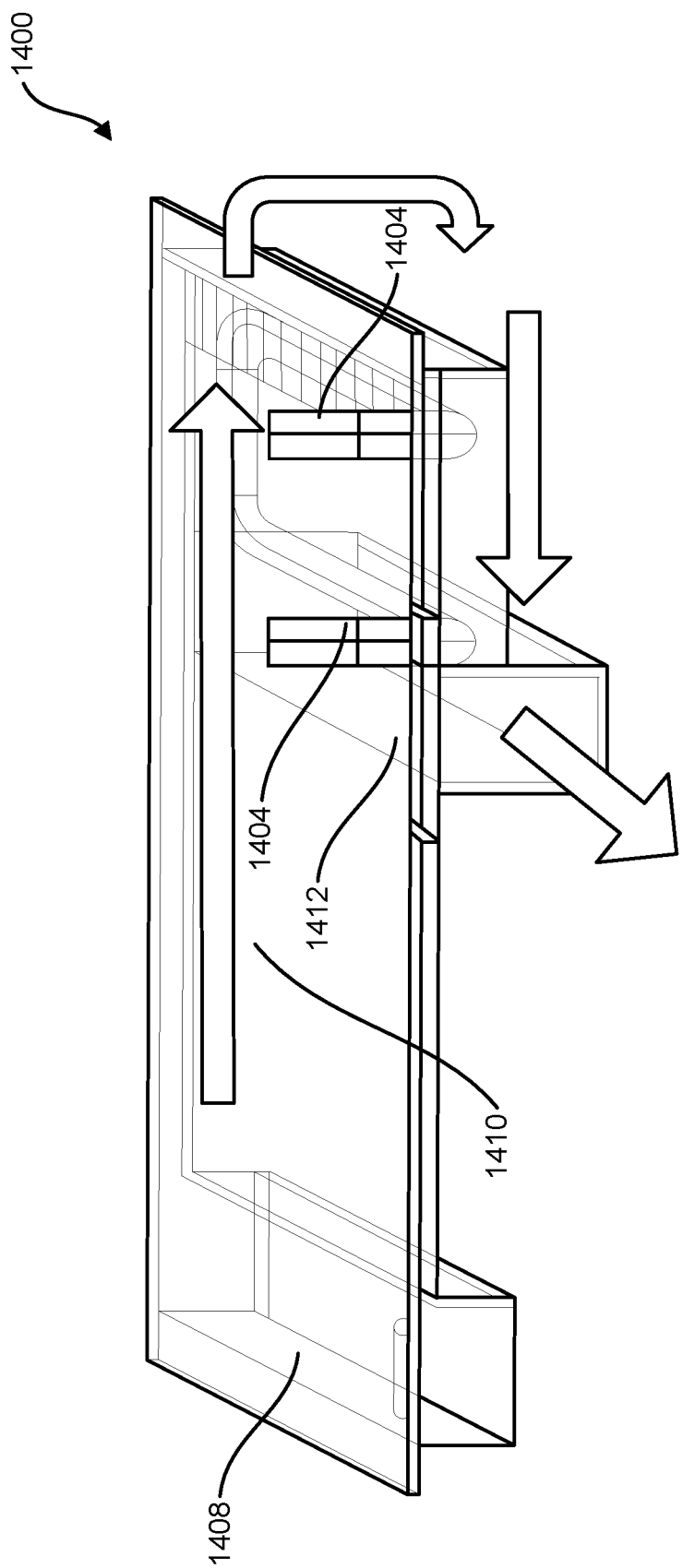
FIG. 15 shows an example cross section of the cooler in FIG. 14.

FIG. 14 shows an example of a cooler 1400. FIG. 15 shows an example cross section of the cooler 1400 in FIG. 14. The cross section is taken along the line D-D in FIG. 14. The cooler 1400 can be used with one or more other examples described elsewhere herein. An inlet 1402 is shown, and the cooler 1400 here has outlet tubes 1404 at an outlet 1406. Coolant enters the inlet 1402 and flows in an inlet manifold 1408 that is coupled to the inlet 1402, as indicated by arrows 1409. The cooler 1400 has a coolant passage 1410 where coolant can flow from the inlet manifold 1408, as indicated by arrows 1411. The coolant passage 1410 can partially be formed by an inside of a cooling surface of the cooler 1400 (e.g., the cooling surface can be the surface 104 of FIG. 1). In this example, a flow direction at the inlet (e.g., the arrows 1409) is opposite to a flow direction at the outlet (e.g., the arrows 1416).

The cooler 1400 has an outlet manifold 1412 coupled to the outlet 1406. The coolant passage 1410 is coupled to the inlet manifold 1408 and to the outlet manifold 1412. Coolant can flow through the coolant passage 1410, through multiple openings 1413 in the coolant passage 1410, past a heating element 1414 and into the outlet manifold 1412. That is, the cooler 1400 shows the openings 1413 leading to the channel(s) where the heating element 1414 is housed. The coolant passage 1410, the inlet manifold 1408, and the outlet manifold 1412 can collectively form a manifold for the cooler 1400, and the heating element 1414 can be positioned inside the manifold. After the coolant passes through the outlet manifold 1412 as indicated by arrows 1416, the coolant can exit the cooler 1400 through the outlet 1406. In some implementations, the outlet 1406 is instead positioned at an opposite end of the cooler 1400 from the inlet 1402. As such, the heating element 1414 is positioned downstream in the flow of coolant from an inside of the cooling surface of the cooler 1400. The housing of the cooler 1400 has a substantially rectangular shape with first and second longer sides parallel to each other, and first and second shorter sides parallel to each other. The inlet 1402 is positioned at the first shorter side (here at the left side in the illustration), and the outlet 1406 is also positioned at the first shorter side.

Figure 16:
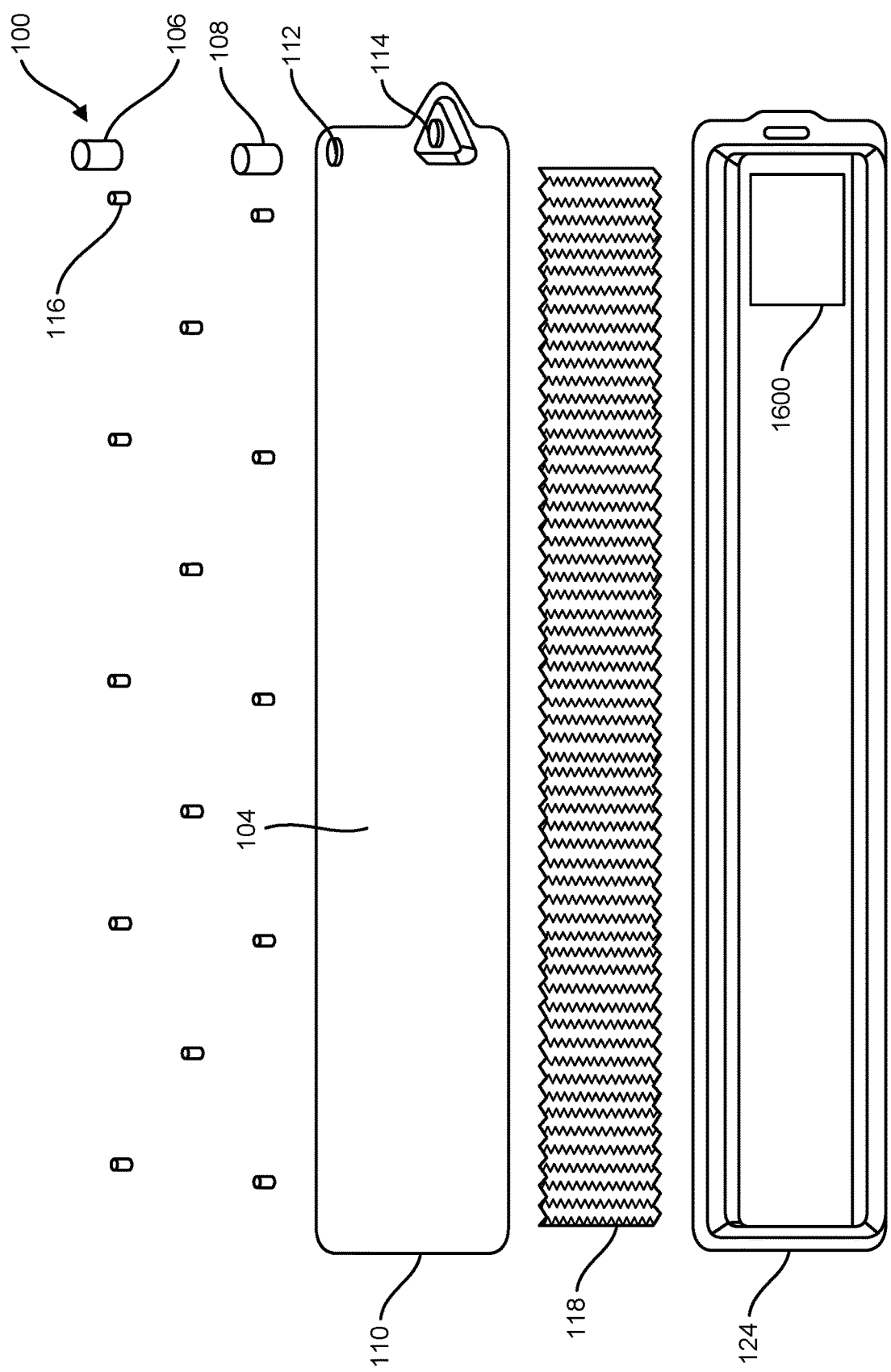
FIG. 16 shows a second example of an exploded view of the cooler of FIG. 1.

FIG. 16 shows a second example of an exploded view of the cooler 100 of FIG. 1. Some components of the cooler are similar or identical to those exemplified above in the description of FIG. 2 and will not be described in detail here. The cooler 100 is configured for use in cooling at least one power electronics unit. The cooler 100 has the surface 104, the inlet tube 106, the outlet tube 108, the cooling plate 110, the inlet 112, the outlet 114, the mount(s) 116, the structure 118, and the base 124. The cooler 100 includes a heating element 1600 positioned at an outside surface of the housing and configured to heat the coolant. The heating element 1600 is controlled independently of the power electronics unit. Any kind of heating element can be used. In some implementations, the heating element 1600 includes a resistive heater. For example, the heating element 1600 can be substantially planar and positioned flat against the outside surface of the heating element 1600.

The terms "substantially" and "about" used throughout this Specification are used to describe and account for small fluctuations, such as due to variations in processing. For example, they can refer to less than or equal to +5%, such as less than or equal to +2%, such as less than or equal to +1%, such as less than or equal to +0.5%, such as less than or equal to +0.2%, such as less than or equal to +0.1%, such as less than or equal to +0.05%. Also, when used herein, an indefinite article such as "a" or "an" means "at least one."

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein.

A number of implementations have been described. Nevertheless, it will be understood that various modifications may be made without departing from the spirit and scope of the specification.

In addition, the logic flows depicted in the figures do not require the particular order shown, or sequential order, to achieve desirable results. In addition, other processes may be provided, or processes may be eliminated, from the described flows, and other components may be added to, or removed from, the described systems. Accordingly, other implementations are within the scope of the following claims.

While certain features of the described implementations have been illustrated as described herein, many modifications, substitutions, changes and equivalents will now occur to those skilled in the art. It is, therefore, to be understood that appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A cooler for power electronics, the cooler comprising:
a housing having a cooling surface configured for contacting the power electronics;
an inlet and an outlet coupled to the housing;
a manifold inside the housing providing a flow of a coolant in the cooler, the manifold coupled to the inlet and the outlet; and
a heating element mounted to the housing and configured to heat the coolant, the heating element controlled independently of the power electronics;
wherein the manifold includes (i) an inlet manifold coupled to the inlet, (ii) an outlet manifold coupled to the outlet, and (iii) a coolant passage coupled to the inlet manifold and to the outlet manifold, the coolant passage partially formed by an inside of the cooling surface;
wherein the manifold is configured so that a first flow direction of the flow inside the coolant passage is substantially perpendicular to a second flow direction of the flow in the inlet manifold and to a third flow direction of the flow in the outlet manifold;
wherein the second and third flow directions are a common flow direction; and
wherein the manifold further comprises a channel structure that houses the heating element, and wherein a fourth flow direction of the flow in the channel structure is opposite to the second and third flow directions.

2. The cooler of claim 1, wherein the heating element is positioned downstream in the flow of the coolant from an inside of the cooling surface.

3. The cooler of claim 2, wherein the heating element is positioned inside the manifold.

4. The cooler of claim 3, wherein the heating element is U-shaped with two arms parallel to each other.

5. The cooler of claim 2, wherein the heating element is positioned at an outside surface of the housing.

6. The cooler of claim 1, further comprising structure inside the coolant passage to affect the flow.

7. The cooler of claim 1, wherein the heating element comprises multiple arms parallel to each other, and wherein the channel structure comprises respective channels for the multiple arms.

8. The cooler of claim 7, wherein the channel structure consists of a first channel and a second channel, wherein the first and second channels are formed on opposite sides of a raised portion inside the manifold, the housing further comprising a member covering the channel structure to form the first and second channels.

9. The cooler of claim 1, wherein the coolant passage is positioned between the heating element and the inside of the cooling surface.

10. The cooler of claim 9, wherein after passing through the outlet manifold in the third flow direction, the coolant makes substantially a 180-degree turn and flows along the heating element in the fourth flow direction.

11. The cooler of claim 1, wherein the housing further comprises multiple openings in the coolant passage, the openings leading to a channel that houses the heating element.

12. The cooler of claim 1, further comprising mounts at the cooling surface, the mounts configured for mounting the power electronics and the cooler to each other.

13. The cooler of claim 1, wherein the housing has a substantially rectangular shape with first and second longer sides parallel to each other, and first and second shorter sides parallel to each other.

14. The cooler of claim 13, wherein the inlet is positioned at the first shorter side, and wherein the outlet is positioned at the first shorter side.

15. A cooler for power electronics, the cooler comprising:

a housing having a cooling surface configured for contacting the power electronics;

an inlet and an outlet coupled to the housing;

a manifold inside the housing providing a flow of a coolant in the cooler, the manifold coupled to the inlet and the outlet; and a heating element mounted to the housing and configured to heat the coolant, the heating element controlled independently of the power electronics;

wherein the manifold includes (i) an inlet manifold coupled to the inlet, (ii) an outlet manifold coupled to the outlet, and (iii) a coolant passage coupled to the inlet manifold and to the outlet manifold, the coolant passage partially formed by an inside of the cooling surface;

wherein the housing has a substantially rectangular shape with first and second longer sides parallel to each other, and first and second shorter sides parallel to each others;

wherein the inlet is positioned at the first shorter side, and wherein the outlet is positioned at the second shorter side;

wherein the heating element is positioned at the second shorter side;

wherein the heating element comprises a coil with multiple turns.

16. The cooler of claim 15, wherein the manifold is configured so that a first flow direction of the flow inside the coolant passage is substantially perpendicular to a second flow direction of the flow in the inlet manifold and to a third flow direction of the flow in the outlet manifold.

17. The cooler of claim 16, wherein the second and third flow directions are opposite to each other.

18. The cooler of claim 15, further comprising mounts at the cooling surface, the mounts configured for mounting the power electronics and the cooler to each other.

* * * * *